(12) United States Patent
Zaidi

(10) Patent No.: US 6,548,314 B1
(45) Date of Patent: Apr. 15, 2003

(54) METHOD FOR ENABLING ACCESS TO MICRO-SECTIONS OF INTEGRATED CIRCUITS ON A WAFER

(75) Inventor: Shoaib Hasan Zaidi, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/015,212

(22) Filed: Dec. 10, 2001

(51) Int. Cl.[7] ................................................ H01L 21/66
(52) U.S. Cl. ........................... 438/14; 438/15; 430/30; 430/312
(58) Field of Search .................. 438/14–17; 430/30, 430/312, 313

(56) References Cited

U.S. PATENT DOCUMENTS 4,968,585 A * 11/1990 Albrecht et al. ............... 216/2
5,420,796 A * 5/1995 Weling et al. ............... 250/234
5,451,489 A * 9/1995 Leedy ........................... 430/30
5,569,399 A * 10/1996 Penney et al. ......... 219/121.69
5,741,614 A * 4/1998 McCoy et al. ................ 430/30
5,834,334 A * 11/1998 Leedy .......................... 438/107

* cited by examiner

Primary Examiner—John F. Niebling
Assistant Examiner—Olivia T Luk
(74) Attorney, Agent, or Firm—Jackson Walker L.L.P.

(57) ABSTRACT

The present invention provides a method of enabling measurement access to small integrated circuit features that comprises selecting a feature of an integrated circuit on a wafer and providing access to the selected feature by removing a portion of the integrated circuit adjacent to the feature, thereby preserving the wafer.

19 Claims, 3 Drawing Sheets

METHOD FOR ENABLING ACCESS TO MICRO-SECTIONS OF INTEGRATED CIRCUITS ON A WAFER

FIELD OF THE INVENTION

The invention relates generally to the manufacture of integrated circuits and, more particularly, to a method for improving access to integrated circuit micro-sections.

BACKGROUND OF THE INVENTION

Measuring the dimensions of features, such as sidewall angles and trenches for devices such as dynamic random access memories (DRAMs), is a critical and difficult task that impacts the design, development and fabrication of integrated circuits (ICs). Critical Dimensions (CDs) are the sizes of the smallest geometrical features, such as the width of interconnect lines, contacts or trenches, that can be formed during integrated circuit device/circuit manufacturing using given technology. Current methods for measuring CDs are either limited by size or result in destruction of the wafer.

Critical Dimension Scanning Electron Microscopy (CD-SEM) is an imaging method with a lateral resolution below 10 nm. A focused beam of electrons is scanned across a sample and an image is constructed based on the detection of secondary electron current. The sample being measured must be coated with a conductive film. Two main types of measurements are employed: 1) top-down SEMs, used for linewidth measurements of features, and 2) feature cross-section measurements. CD-SEMs are able to measure dimensions near the surface of a chip, but they cannot collect secondary electron signals from the bottom of a hole or trench.

Atomic Force Microscopy (AFM) is a method that is capable of surface visualization with near-atomic resolution. AFM provides a measurement of the roughness of solid surfaces based on electrostatic interactions between the surface and the measuring tip. The measuring tip can be set above the surface, on the surface, or can tap the surface, oscillating at high frequency (tapping mode). However, if the openings of the features are small, AFM tips may not be able to reach into them. Currently, sidewall angles for these features are measured from cross-section SEM images. This requires cleaving and destruction of the wafer.

Many features of interest in integrated circuit manufacturing are difficult to measure by using AFMs or top-down CD-SEMs. This is because either the tip of the AFM is too large for the opening of the features or the collection angle for the secondary electrons is steep. There are many such parameters for which measurements are desired, such as sidewall angles and profiles and trench and various recess depths.

Accordingly, there is a need for a method to enable access to small features of integrated circuits, a method that does not result in the destruction of the wafer. The present invention enables access to small integrated circuit features by increasing the size of openings to those features without destroying the wafer. The present invention uses masking and etching to clear sufficiently large areas to allow a measurement tool ingress.

More specifically, the present invention provides a method of enabling measurement access to small integrated circuit features that comprises selecting a feature of an integrated circuit on a wafer and providing access to the selected feature by removing a portion of the integrated circuit adjacent to the feature, thereby preserving the wafer.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which.

DETAILED DESCRIPTION

While the making and using of various embodiments of the present invention are discussed herein in terms of preparing and measuring an integrated circuit trench, it should be appreciated that the present invention provides many inventive concepts that can be embodied in a wide variety of contexts. The specific embodiments discussed herein are merely illustrative of specific ways to make and use the invention, and are not meant to limit the scope of the invention.

Figure 1:
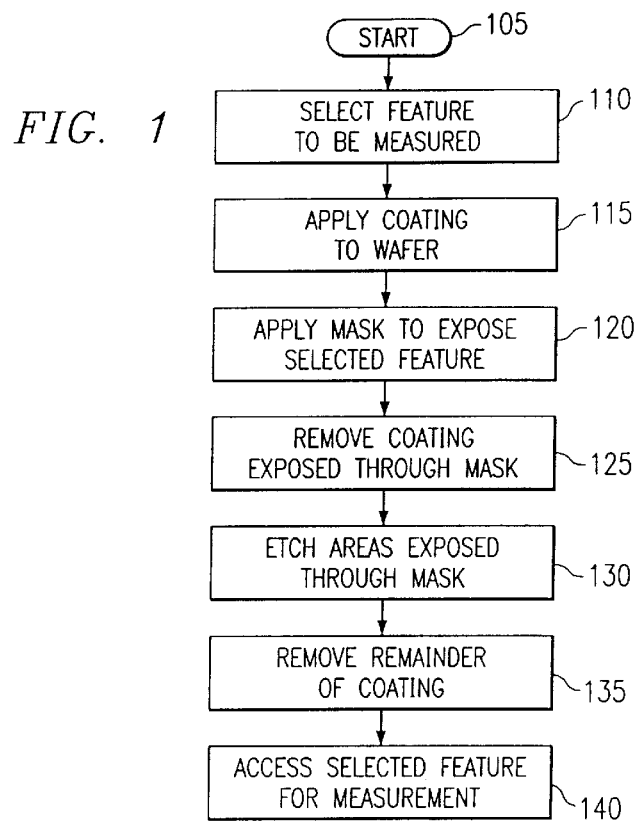
FIG. 1 displays a flow diagram in accordance with an embodiment of the present invention.

The present invention enables access to small integrated circuit features by increasing the size of openings to such features without destroying the wafer. FIG. 1 displays a flow diagram in accordance with an embodiment of the present invention. Starting at terminal 105, a integrated circuit feature measured is selected for measurement in block 110. The entire wafer is then coated in block 115, with, for example, a conventional photosensitive resist. Next, a mask, such as a conventional lithographic mask, is applied to the coated wafer in block 120 to expose the selected integrated circuit feature. In block 125, using any desired conventional process, the resist is removed from the areas of the wafer exposed by the mask. The exposed areas are then etched in block 130. Finally, the resist is removed from the remainder of the wafer in block 135, resulting in an enlarged opening capable of receiving an AFM tip. At block 140, the selected integrated circuit feature is accessed for measurement.

Figure 2:
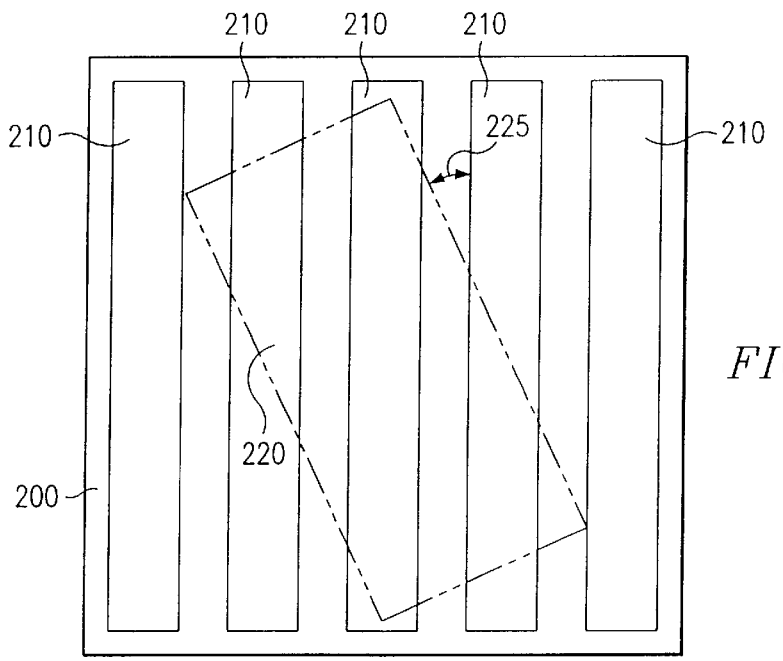
FIG. 2 illustrates a mask positioned in accordance with an embodiment of the present invention.

Turning now to FIG. 2, mask 220 positioned in accordance with an embodiment of the present invention is illustrated. Wafer 200 includes trenches 210. Although FIG. 2 displays trenches 210 as long trenches, the present invention is also suitable for circular or elliptical trenches. For measurements of trenches 210, mask 220 is skewed at angle 225 relative to the longitudinal direction of trenches 210. By skewing mask 220, improved access to at least one wall (described in relation to FIG. 3, below) of one of trenches 210 is realized. Additionally, if mask 220 is skewed, its placement need not be precise. If mask 220 translates or rotates a small amount relative to trenches 210, the present invention can still achieve the desired result. Alternatively, mask 220 may be rotated 180° about an axis parallel to the longitudinal direction of trenches 210 to enable improved access to other areas of trenches 210. Furthermore, a single mask 220 may also be used in conjunction with other masks 220. For example, two masks 220 may be placed to form a "V" on wafer 200, thereby bridging multiple, adjacent trenches 210 at mirror image angles. Such a configuration could, for example, enable measurement of the width of an area between multiple trenches 210 via the "peninsula" formed between the legs of the "V."

Figure 3:
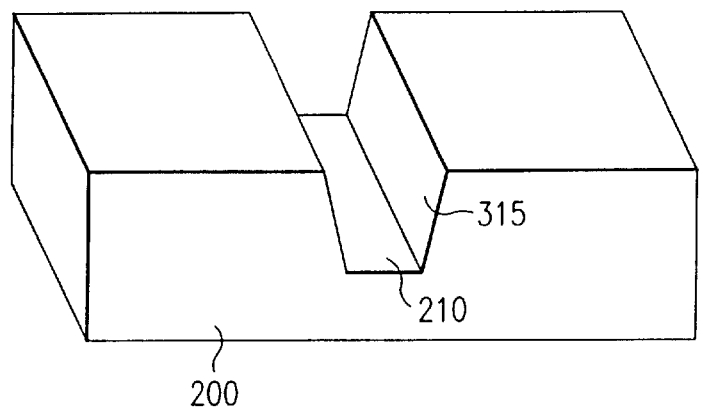
FIG. 3 illustrates a three dimensional view of a representative feature to be measured.

FIG. 3 illustrates a three dimensional view of a representative feature, trench 210, to be measured. Trench 210 is an element of wafer 200. For purposes of this discussion, the angle of sidewall 315 of trench 210 is the critical dimension (CD) to be measured. Increased access to trench 210 will also allow other features to be measured. Trench 210 is currently too small to allow a measurement tool, such as an AFM tip, access. In this example, the present invention will create an opening large enough for an AFM tip to measure the angle of sidewall 315.

Figure 4:
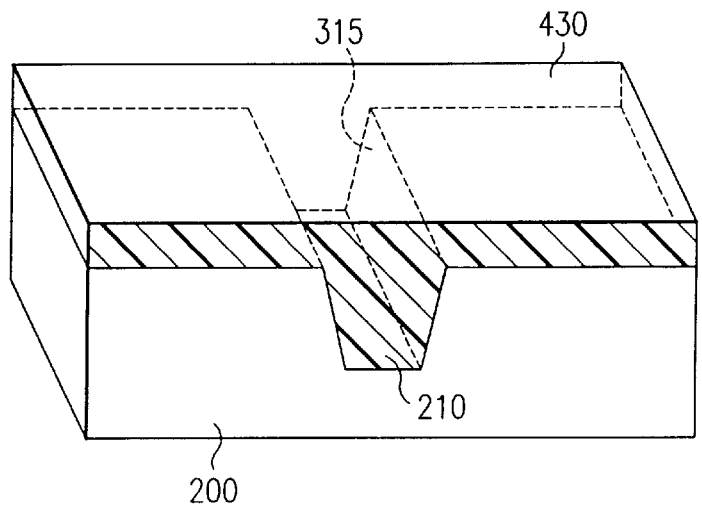
FIG. 4 illustrates FIG. 3 coated in accordance with an embodiment of the present invention.
Figure 5:
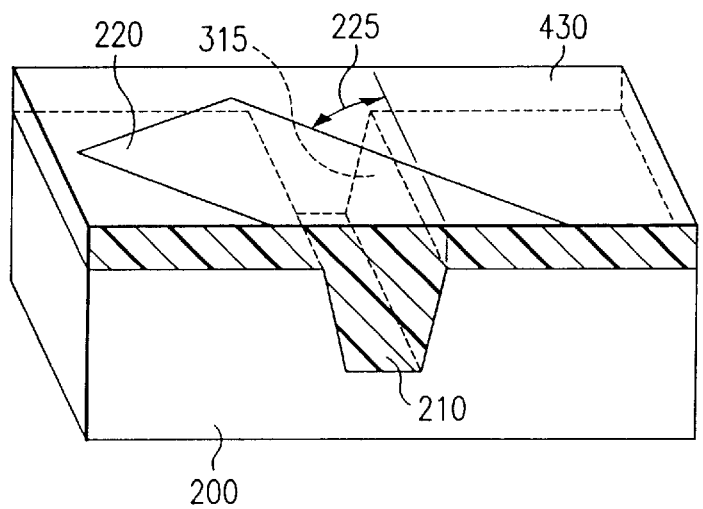
FIG. 5 illustrates FIG. 4 with areas of coating exposed through a mask in accordance with an embodiment of the present invention.

The present invention initially coats wafer 200 with coating 430 as shown in FIG. 4. Photosensitive resist would be an exemplary choice for coating 430. FIG. 4 illustrates FIG. 3 coated in accordance with an embodiment of the present invention. Although all of wafer 200 is covered by coating 430, only a small section of coating 430 is shown in FIG. 4. Trench 210 with sidewall 315 is beneath coating 430. Next, mask 220 is positioned on coating 430. A section of coating 430 is exposed through mask 220. FIG. 5 illustrates FIG. 4 with areas of coating 430 exposed through mask 220 in accordance with an embodiment of the present invention. Again, although all of wafer 200 is covered by coating 430, only a small section of coating 430 is shown in FIG. 5. Mask 220 is shown at angle 225 relative to the longitudinal direction of trench 210. Trench 210 with sidewall 315 is now beneath both coating 430 and mask 220.

Figure 6:
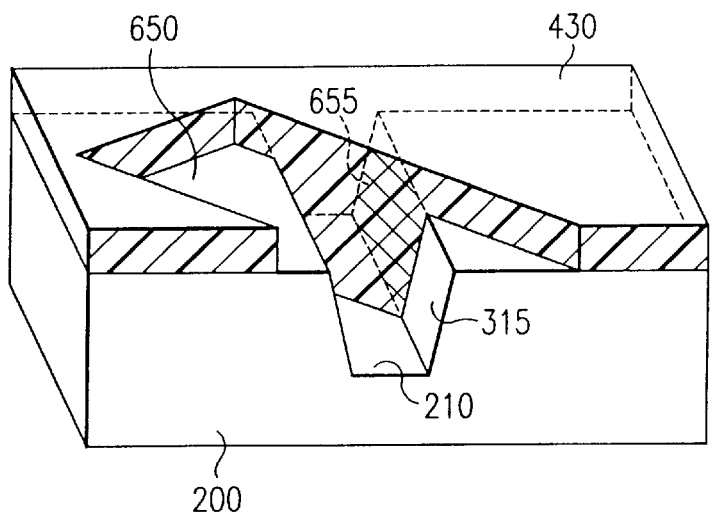
FIG. 6 illustrates FIG. 5 with exposed areas of coating removed in accordance with an embodiment of the present invention.
Figure 7:
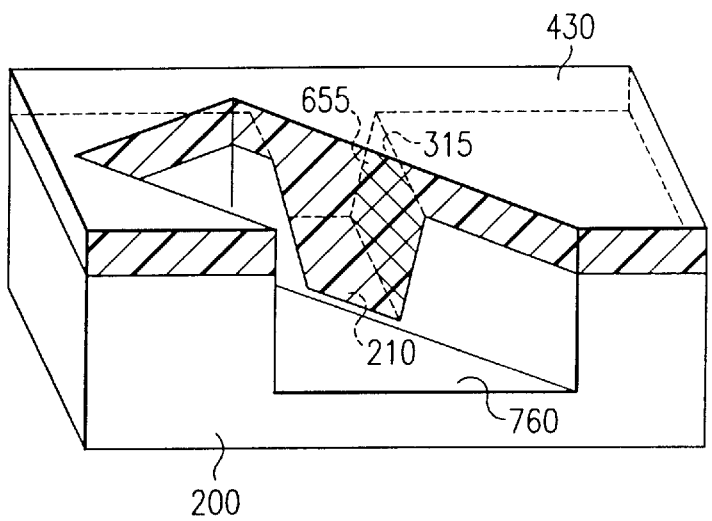
FIG. 7 illustrates FIG. 6 after etching in accordance with an embodiment of the present invention.
Figure 8:
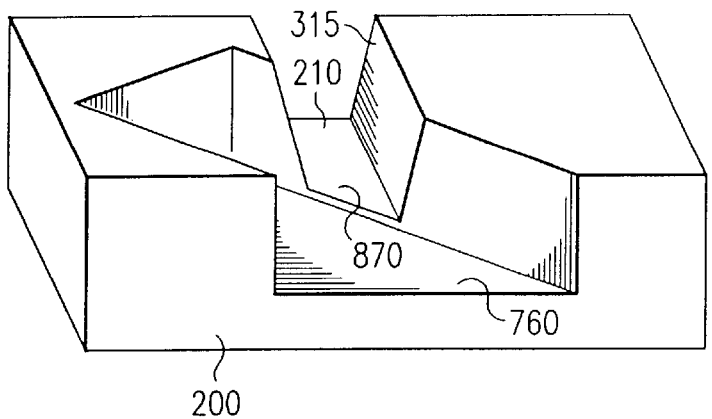
FIG. 8 illustrates FIG. 7 after coating removal in accordance with an embodiment of the present invention.

FIG. 6 illustrates FIG. 5 with the exposed areas of coating 430 removed in accordance with an embodiment of the present invention. Coated wafer 200 now includes exposure 650 through coating 430. Although a portion of trench 210 with sidewall 315 is revealed in exposure 650, it is important to note that coating 430 still covers and protects a portion of sidewall 315 of trench 210(denoted by area 655). Exposure 650 is then etched to produce exposure 760 as shown in FIG. 7, which illustrates FIG. 6 after etching in accordance with an embodiment of the present invention. Although exposure 760 is much larger than exposure 650, coating 430 of wafer 200 still protects sidewall 315 of trench 210 (denoted by area 655). Finally, coating 430 is removed from wafer 200. The result is shown on wafer 200 in FIG. 8. Exposure 760 facilitates greater access to trench 210 at opening 870. Exposure 760 allows a measurement tool, such as an AFM tip, to be inserted, generally parallel to the longitudinal direction of trench 210, into trench 210 through opening 870, thereby enabling the measurement of the angle of sidewall 315.

The present invention can also be performed with a dedicated lithography process or combined with a subsequent lithography-etch step. The choice would depend on the application. For example, if the depth of a subsequent etch will clear sufficient area on the sidewall, the lithography-etch for improving access to micro-sections can be incorporated, rather than performed independently.

Additionally, another embodiment includes the selective use of masks on disparate areas of a wafer. For example, the present invention can be used on a particular chip on a wafer or a specific area of an individual chip without causing loss of product. It is not necessary to use the entire chip. An exemplary application of the present invention would be to test areas of an actual product chip. Alternatively, edge chips, that may or may not be partial chips and do not yield product, can be used because similar measurements will be obtained from chip to chip across a given wafer.

Although exemplary embodiments of the present invention have been described in detail, it will be understood by those skilled in the art that various modifications can be made therein without departing from the spirit and scope of the invention as set forth in the appended claims.

What is claimed is:

1. A method for enabling measurement access to a feature of an integrated circuit device on a wafer, comprising:

selecting a feature of an integrated circuit device on a wafer; and providing access to the selected feature for measurement thereof without destroying the wafer, including removing a portion of the integrated circuit device adjacent to the selected feature by etching said portion away.

2. The method of claim 1 wherein the removing step includes applying a coating to the wafer.

3. The method of claim 2 wherein the applying step includes applying a photosensitive resist coating to the wafer.

4. The method of claim 2 wherein the removing step includes placing a mask on the wafer, the mask revealing an area of the integrated circuit device including the selected feature.

5. The method of claim 4 wherein the placing step includes placing a lithographic mask on the wafer, the lithographic mask revealing an area of the integrated circuit device including the selected feature.

6. The method of claim 4 wherein the removing step includes exposing the area of the integrated circuit device including the selected feature.

7. The method of claim 6 wherein the exposing step includes removing the coating from the exposed area of the integrated circuit device.

8. The method of claim 6 wherein the exposing step includes etching the exposed area of the integrated circuit device.

9. The method of claim 8 including removing the coating from the wafer.

10. A method for enabling measurement access to a feature of an integrated circuit device on a wafer, comprising:

selecting a feature of an integrated circuit device on a wafer; and providing access to the selected feature for measurement thereof without destroying the wafer, including removing a portion of the integrated circuit device adjacent to the selected feature, the removing step including applying a coating to the wafer and placing a mask on the wafer, the mask revealing an area of the integrated circuit device including the selected feature, wherein the placing step includes placing the mask at a skewed angle relative to the selected feature.

11. The method of claim 10 wherein the selected feature includes a portion of a longitudinal trench, including placing the mask at the skewed angle relative to a longitudinal direction of the longitudinal trench.

12. The method of claim 11 wherein the selected feature is a sidewall angle of a longitudinal trench.

13. A method for enabling measurement access to a feature of an integrated circuit device on a wafer, comprising:
   selecting a feature of an integrated circuit device on a wafer; and
   providing access to the selected feature for measurement thereof without destroying the wafer, including removing a portion of the integrated circuit device adjacent to the selected feature, wherein the selected feature includes a portion of a trench.

14. The method of claim 13 wherein the trench is a longitudinal trench.

15. The method of claim 13 wherein the selected feature is a sidewall angle of the trench.

16. The method of claim 1 including inserting a measurement device into a space previously occupied by the removed portion of the integrated circuit device to thereby gain measurement access to the selected feature.

17. The method of claim 16 wherein the inserting step includes inserting an atomic force microscopy (AFM) tip into said space.

18. The method of claim 17 wherein the selected feature is a portion of a longitudinal trench, and inserting includes inserting the AFM tip into the trench in a direction generally parallel to a longitudinal direction of the trench.

19. The method of claim 18 wherein the selected feature is a sidewall angle of the longitudinal trench.

* * * * *